US006468908B1

United States Patent
Chen et al.

(10) Patent No.: US 6,468,908 B1
(45) Date of Patent: Oct. 22, 2002

(54) AL-CU ALLOY SPUTTERING METHOD WITH POST-METAL QUENCH

(75) Inventors: Cheng-Shien Chen, Hsin-Chu (TW); Li-Der Chen, Shin-Dian (TW); Chih-Min Wen, Hsin Chu (TW); Chung Liu, Taipei (TW); Chih-Ching Lin, Typing (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/900,406

(22) Filed: Jul. 9, 2001

(51) Int. Cl.[7] .............................................. H01L 21/44
(52) U.S. Cl. ..................... 438/687; 438/688; 438/627; 438/643; 438/653; 438/669
(58) Field of Search ................................. 438/687, 688, 438/627–628, 643–644, 653, 669, 625, 629, 637–640, 672, 675

(56) References Cited

U.S. PATENT DOCUMENTS

| | | | | |
|---|---|---|---|---|
| 5,506,177 A | * | 4/1996 | Kishimoto et al. | 438/624 |
| 5,593,919 A | * | 1/1997 | Lee | 438/626 |
| 5,654,216 A | * | 8/1997 | Adrian | 438/627 |
| 5,656,543 A | * | 8/1997 | Chung | 438/625 |
| 5,814,556 A | | 9/1998 | Wee et al. | 438/620 |
| 5,843,842 A | | 12/1998 | Lee et al. | 438/688 |
| 5,918,149 A | | 6/1999 | Besser et al. | 438/680 |
| 5,930,673 A | | 7/1999 | Chen et al. | 438/643 |
| 5,994,217 A | | 11/1999 | Ng | 438/636 |
| 5,994,219 A | | 11/1999 | Lin et al. | 438/669 |
| 6,103,630 A | * | 8/2000 | Lee et al. | 216/58 |
| 6,159,839 A | * | 12/2000 | Jeng et al. | 438/618 |
| 6,235,633 B1 | * | 5/2001 | Jang | 438/627 |

* cited by examiner

Primary Examiner—Tuan H. Nguyen
Assistant Examiner—Thanh Nguyen
(74) Attorney, Agent, or Firm—George O. Saile; Stephen B. Ackerman

(57) ABSTRACT

This invention relates to a method of fabricating metal wiring, whereby sputtered metal is rapidly cooled down by a post-metal quenching process, to prevent deleterious $CuAl_2$ precipitation. The main embodiments are the formation of a TiN reactively sputtered bottom barrier layer, followed by a sputtered Al—Cu alloy wiring layer immediately followed by an in situ post-metal quench (key step), then followed by a reactively sputtered second TiN top barrier layer. The "in situ" post-metal quench is especially effective by employing wafer backside cooling using low temperature helium gas or argon gas, cooling the substrate from a high temperature range of 450 to 150 °C., to a low temperature range near room temperature, in a short time interval of between 30 to 180 seconds. The $CuAl_2$ precipitates if allowed to form, block the etch removal of the underlying TiN layer causing electrical shorts between closely spaced lines.

28 Claims, 3 Drawing Sheets

AL-CU ALLOY SPUTTERING METHOD WITH POST-METAL QUENCH

BACKGROUND OF THE INVENTION (1) Field Of The Invention

This invention relates to a method of fabrication for metal wiring used in semiconductor integrated circuit devices, and more specifically, to an aluminum copper alloy sputtering method, whereby the sputtered metal is rapidly cooled down by a post-metal quenching process, to prevent deleterious $CuAl_2$ precipitation.

(2) Description Of Related Art

As an introduction and background to Prior Art, the conventional processing schemes for Al—Cu, Al—Cu—Si and related alloys and compounds used in combination with TiN anti-reflection coatings (ARC) or metal barriers, describe various wiring deposition heating and cooling treatments, e.g., pre-cooling of wafers, cooling during deposition and controlled cooling after deposition, to prevent deleterious effects, i.e., silicon precipitation and TiN/Al film stress effects.

Related Prior Art background patents will now be described in this section.

U.S. Pat. No. 5,843,842 entitled "Method for Manufacturing a Semiconductor Device Having a Wiring Layer Without Producing Silicon Precipitates" granted Dec. 1, 1998 to Lee et al. teaches various heat treatment processes to avoid silicon precipitates and aluminum spiking in a conducting wiring layers. The first metal layer is an Al—Si or Al-Cu-Si alloy not more than one quarter of a predetermined thickness of the wiring layer, and the second metal layer is pure Al, or alloys of Al—Ti or Al—Cu. These layers are deposited at low temperature, below 150° C. The wiring layer is heat-treated at various times and temperatures to avoid deleterious effects in the wiring layer.

U.S. Pat. No. 5,918,149 entitled "Deposition of a Conductor in a Via Hole or Trench" granted Jun. 29, 1999 to Besser et al. teaches various TiN/Al sputtering, physical vapor deposition (PVD), and titanium chemical vapor deposition (CVD) process recipes. After a three step Al or alloy sputtering deposition process, with high, then low power and then high power again, the wafer is cooled and polished. The barrier layer is formed of titanium type compounds, e.g., titanium nitride, titanium oxynitride, titanium carbonitride, or titanium silicide.

U.S. Pat. No. 5,994,219 entitled "Add One Process Step to Control the Si Distribution of AlSiCu to Improved Metal Residue Process Window" granted Nov. 30, 1999 to Lin et al. teaches an AlSiCu alloy wiring process with a TiN barrier. Claimed is a pre-metal cooling step with wafer immersion for 30 seconds to cool the wafer to about 11 ° C., just prior to the metal process. Cooling before the AlSiCu deposition step, resulted in low metal residue for wiring formation.

U.S. Pat. No. 5,930,673 entitled "Method for Forming a Metal Contact" granted Jul. 27, 1999 to Chen et al. describes a method of fabricating an aluminum metal contact and controlled, relative low deposition rate, ramping both deposition rate and temperature during the deposition, which results in the device being heated from cooler temperatures within the chamber. The method tends to deposit aluminum in contact vias without void formation.

U.S. Pat. No. 5,994,217 entitled "Post Metallization Stress Relief Annealing Heat Treatment for ARC TiN Over Aluminum Layers" granted Nov. 30, 1999 to Ng describes a method of fabricating a low stress, anti-reflective coating (ARC) of TiN, which is over Al/Cu/Si sputtered layers. A post metallization, three step heat treatment is performed on the layers of sputtered metal layers and the ARC TiN top layer. First, a controlled temperature ramp up step is performed. Second a temperature hold step is performed at 450° C. for about 30 seconds. Third, a ramp down in temperature is performed at a controlled rate. This heat treatment described reduces the stress between the ARC TiN and Al layers.

U.S. Pat. No. 5,814,556 entitled "Method of Filling a Contact Hole in a Semiconductor Substrate with a Metal" granted Sep. 29, 1998 to Wee et al. discloses a method of filling with aluminum or aluminum alloy, a high aspect-ratio contact hole. Backside wafer cooling of the semiconductor wafer substrate is performed prior to and during the deposition of the aluminum or aluminum alloy film, in film deposition temperatures in the range between −25° C. and room temperature. A non-contact type gas conduction method is used for lowing the deposition temperature, by using, e.g., liquid nitrogen, helium (He) and cooling water.

SUMMARY OF THE INVENTION

This invention relates to a method of fabrication for metal wiring used in semiconductor integrated circuit devices, and more specifically, to an aluminum copper alloy sputtering method, whereby the sputtered metal is rapidly cooled down by a post-metal quenching process, to prevent deleterious $CuAl_2$ precipitation.

The main embodiments of the present invention are the formation of a TiN sputtered bottom barrier layer followed by a sputtered Al—Cu wiring layer with an in situ post-metal quench (key step), followed by a second TiN top barrier layer. The key processing step is the post-metal quench after sputter deposition of the Al—Cu wiring layer, to prevent $CuAl_2$ precipitation. The $CuAl_2$ precipitates, if allowed to form, can result in deleterious residues in the wiring lines after wiring line patterning and etching. Furthermore, these residues block the etchant removal of the underlying bottom TiN layer, and in effect cause electrical shorts, especially between closely spaced wiring lines.

Several manifestations of the key aspects of the present invention follow, all to achieve a post-metal quench or very rapid cool down step, after sputtered Al—Cu wiring deposition. Basically, insert an in situ, one-step cool down step between the Al—Cu deposition and the second TiN deposition to quench the wafer temperature. Alternately, use another AlCu chamber in a cluster tool to achieve in situ cooling by setting the chamber heater to room temperature. Practically and most effective is to employ an in situ cool down recipe in the Al—Cu deposition chamber, where the wiring layer is deposited, and rapidly quench the wafer after sputter deposition by backside wafer cooling with low temperature helium gas or argon gas. Note, all the "standard" deposition processes and tool recipes for the TiN barrier, Al—Cu wiring, and top TiN barrier remain the same. Thus, the post-metal quench solves the $CuAl_2$ precipitate problem directly, without the need for addition process and recipe changes.

By not requiring addition processing changes, in the related sputter deposition processing steps of bottom TiN barrier, Al—Cu wiring, and top TiN barrier layer, the desirable optimum deposition conditions for step coverage and high aspect ratio contacts, can be achieved for surface mobility and flow without compromising these layers or recipes. Furthermore, no additional changes were required in patterning and etching of the metal wiring lines. Therefore, the post-metal quench method solves the deleterious effects and assures the integrity of the metal wiring, shown in the invention's specifications.

This invention has been summarized above and described with reference to the preferred embodiments. Some processing details have been omitted and are understood by those skilled in the art. More details of this invention are stated in the "DESCRIPTION OF THE PREFERRED EMBODIMENTS" section.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

This invention relates to a method of fabrication for metal wiring used in semiconductor integrated circuit devices, and more specifically, to an aluminum copper alloy sputtering method, whereby the sputtered metal is rapidly cooled down by a post-metal quenching process, to prevent deleterious $CuAl_2$ precipitation.

Figure 1A:
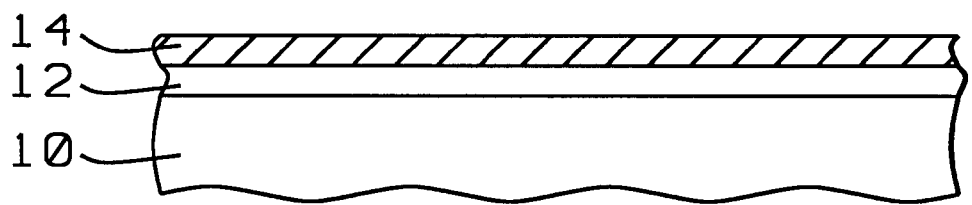
FIGS. 1A–1D, which in cross-sectional representation, illustrates the method of the main embodiments of the present invention.

Referring to FIGS. 1A–1D, the main embodiments of the present invention are described with detailed specification in the following paragraphs. Referring to FIG. 1A, which in cross-sectional view illustrates the first process steps of the present invention. Provided in FIG. 1A is a substrate 10, which is a semiconductor of mono-crystalline silicon or an IC module. Over the substrate 10 is an insulating layer 12. The first processing step of this invention is to deposit a TiN bottom or first barrier metal layer (14). The metal barrier material can also be selected from the group consisting of TiN type materials, deposited by sputtering, physical vapor deposition (PVD), in a temperature of between room temperature to 300° C., and in a thickness range between 100 to 2,000 Angstroms. Nominal process conditions that were used are: titanium nitride reactively sputtered with argon and nitrogen gases, TiN thickness 250 Angstroms at about room temperature to approximately 150° C.

Figure 1B:
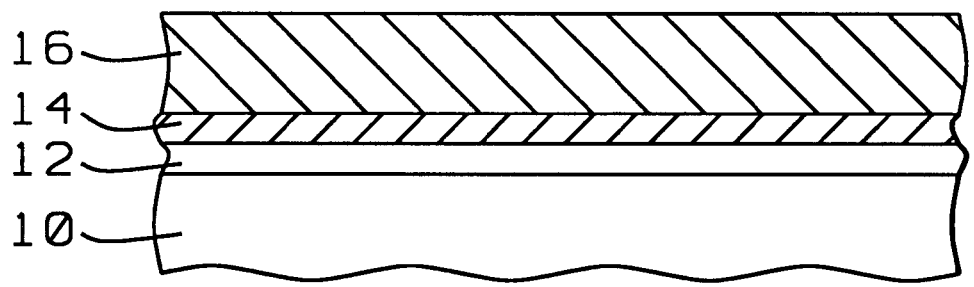

Referring to FIG. 1B, which in cross-sectional view illustrates the Al—Cu alloy layer (16) over the first barrier layer. The aluminum copper alloy layer is selected from the group consisting of Al—Cu alloys, and Al—Cu—Si alloys, in composition range of about (Al 99.5%, Cu 0.5% atomic percent) and (Al 98.5%, Cu 0.5%, Si 1.0% atomic percent), deposited by sputtering, physical vapor deposition (PVD), in a temperature range of between 150 to 450° C., and in a thickness range between 500 to 20,000 Angstroms. Nominal process conditions that were used are: Al—Cu DC magnetron sputtered with argon gas, Al—Cu thickness 4,000 Angstroms with substrate temperatures near 250 to about 300° C.

Immediately following the sputtering of the Al—Cu wiring layer, a rapid cool down step follows, whereby an in situ post-metal quench (key step of present invention), is applied to the substrate. More specifically, the rapid cool down or quench is performed immediately after the deposition of Al—Cu wiring layer, by backside substrate or wafer cooling using a common clamp or "e-chuck" wafer holder and rapidly flowing helium gas or argon gas with a flow rate of about 5 to 40 sccm. This quench or rapid cool down process rapidly cools down the wafer from a temperature range of about 450 to 150° C., to near room temperature, in about 30 to 180 seconds. Also radiation cooling contributes to the wafer cool down process, but at these relatively "low temperatures" radiation effects are minimal. Heat transfer by means of conduction by helium or argon gas is the primary cooling mechanism. Other methods of cooling the wafer can be employed, e.g., transferring the wafer under vacuum after Al—Cu deposition, to an unused chamber that is at or near room temperature, in a cluster tool arrangement with multiple chambers. The quench step or rapid cool down essentially cools the wafer, thereby preventing the formation of $CuAl_2$ precipitates The $CuAl_2$ precipitates, if allowed to form, can result in deleterious residues in the wiring lines after wiring line patterning and etching, in these subsequent process steps. The residues block the etchant removal of the underlying bottom TiN layer, and in effect cause electrical shorts, especially between closely spaced wiring lines. Therefore, the key processing step of the present invention is the post-metal quench after sputter deposition of the Al—Cu wiring layer, to prevent precipitation of $CuAl_2$.

Figure 1C:
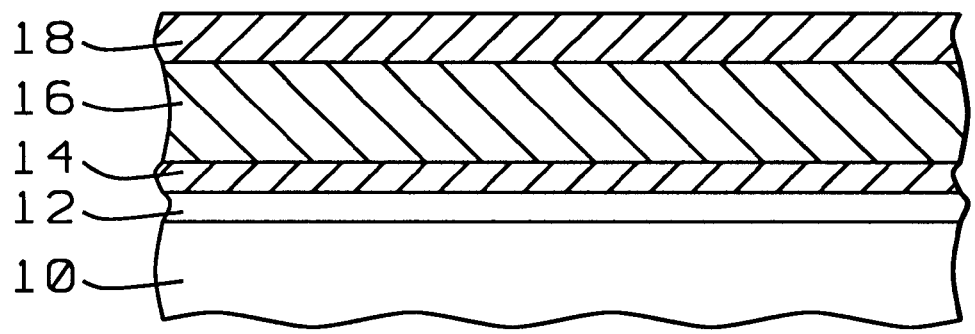

Referring to FIG. 1C, which in cross-sectional view illustrates the deposit of another TiN layer, which is the top or second barrier metal layer (18), deposited over the aluminum copper alloy layer (16). The metal barrier material can be selected from the group consisting of TiN type compounds, deposited by sputtering, physical vapor deposition (PVD), in a temperature of between room temperature to 300° C., and in a thickness range between 100 to 2,000 Angstroms. Nominal process conditions that were used are: titanium nitride reactively sputtered with argon and nitrogen gases, TiN thickness of about 700 Angstroms, with processes with and without temperature control (with reference to FIG. 3). With the in-situ post-metal quench process, this sputter deposition only needs to be in a limited period, not to expose the Al—Cu alloy layer (16) to too much time at temperature, ranging from 150 to 350° C. Thus, precipitation Of $CuAl_2$ is prevented.

Figure 1D:
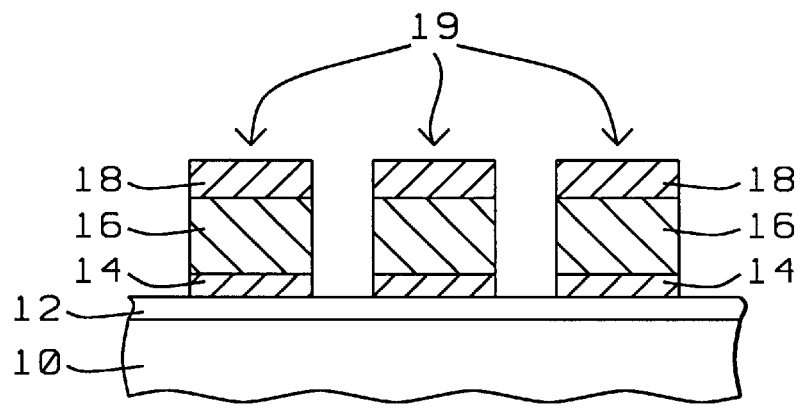

Referring to FIG. 1D, which in cross-sectional view illustrates the formation of the patterned wiring layer (19). which consists of a bottom TiN barrier layer (14), a Al—Cu layer (16) and a top TiN barrier layer (18). The patterned wiring layer (19) is formed by convention methods employing photoresist patterning and wiring line etching, using reactive ion etch (RIE) for straight sidewalls. No $CuAl_2$ precipitates are shown in FIG. 1D. Had these precipitates been allowed to form, these residues would have blocked the etchant and the subsequent removal of the underlying bottom TiN layer (14), thus, causing electrical shorts, especially between closely spaced wiring lines (19).

Several manifestations of the key aspects of the present invention follow, all to achieve a post-metal quench or very rapid cool down step, after sputtered Al—Cu wiring deposition. Basically, insert an in situ, one-step cool down step between the Al—Cu deposition and the second TiN deposition to quench the wafer temperature. Alternately, as another method: use another AlCu chamber in a cluster tool to achieve in situ cooling by setting the chamber heater to room temperature. However, practically and most effective is to employ an in situ cool down recipe in the Al—Cu deposition chamber, where the wiring layer is deposited, and rapidly quench the wafer after sputter deposition by backside wafer cooling with low temperature helium gas or argon gas. Note, all the "standard" deposition processes and tool recipes for the TiN barrier, Al—Cu wiring, and top TiN barrier remain the same. Thus, the pot-metal quench solves the $CuAl_2$ precipitate problem directly, without the need for addition process and recipe changes.

By not requiring addition processing changes, in the related sputter deposition processing steps of bottom TiN barrier, Al—Cu wiring, and top TiN barrier layer, the desirable optimum deposition conditions for step coverage and high aspect ratio contacts, can be achieved for surface mobility and flow without compromising these layers or recipes. Furthermore, no additional changes were required in patterning and etching of the metal wiring lines. Therefore, the post-metal quench method solves the problem of deleterious effects and assures the integrity of the metal wiring, shown in the invention's specifications.

Figure 2:
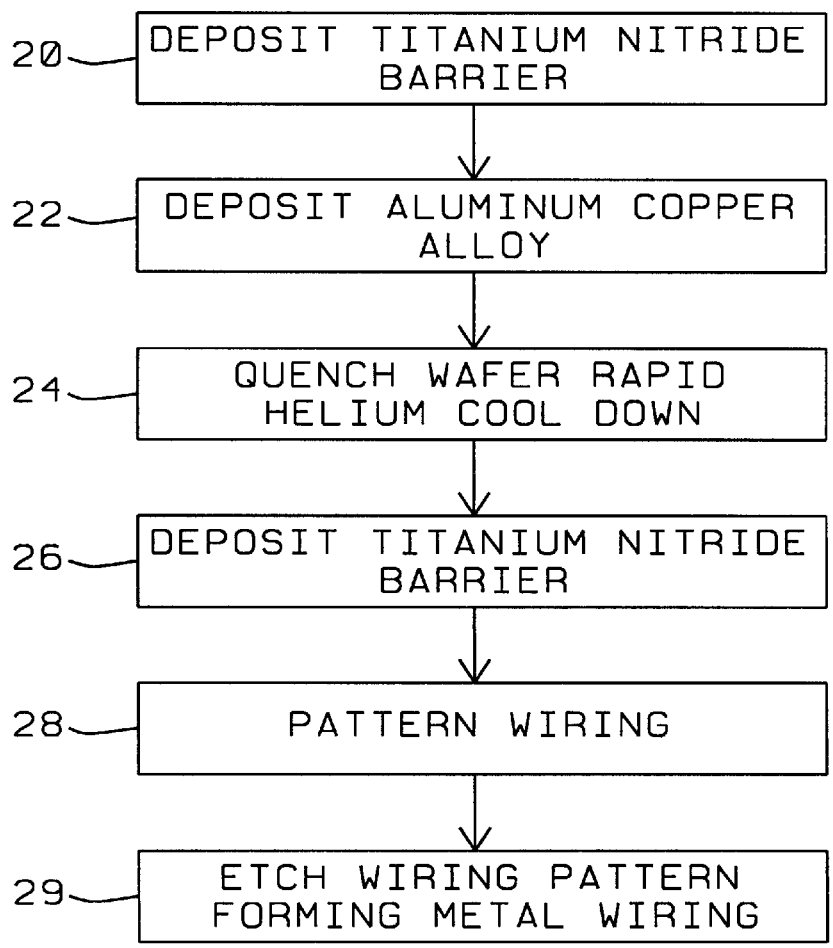
FIG. 2, which is a block diagram illustrating the key process steps of the present invention.

Referring to FIG. 2, which is a block diagram illustrating the key process steps of the present invention, the following steps are outlined: TiN barrier deposition 20, AlCu alloy deposition 22, rapid wafer quench 24, TiN barrier. deposition 26, patterning of the wiring 28, and finally the etching and forming of the metal wiring 29.

Figure 3:
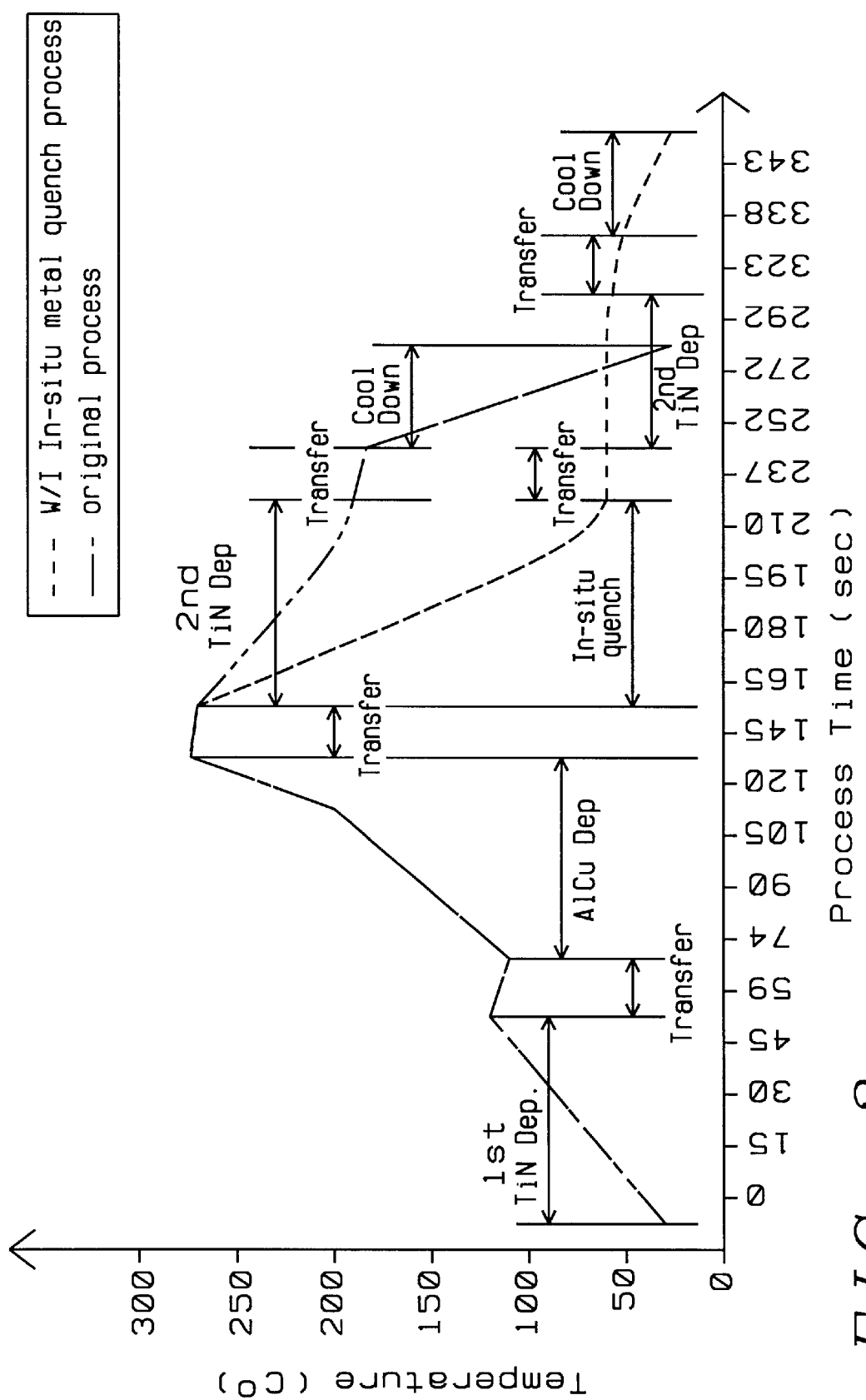
FIG. 3, which is a graph of substrate temperature versus process time for TiN bottom layer deposition, AlCu deposition and following the top layer TiN deposition, "original process" and with added in situ quench process.

Referring to FIG. 3, which is a graph of substrate temperature versus process time for the TiN bottom layer deposition, AlCu deposition and followed by the top layer TiN deposition, for two sets of data: the "original process" (dotted line) and the new added in situ quench process, of the present invention (dashed line). The first portion of each set of data match for each type of process, "original process" and for the new process of the present invention, that is bottom (first) TiN barrier layer (14) deposition of 250 Angstroms in thickness (without temperature heater control in chamber, and the AlCu layer (16) deposition of 4,000 Angstroms at from approximately 100 to 270° C. However, the latter portion of the data sets differ immediately after the AlCu layer (16) deposition step. The original process remains close to the AlCu deposition temperature for a considerable amount of time. The new process of the present invention shows a rapid cool-down by an in situ quench from about 270° C. to a range from about 100° C. to about room temperature in a short amount of time. Another difference in the two data sets is the last portion of the graph. The final deposition is of the TiN top barrier layer (18), which is 700 Angstroms thick. The quenched film temperature data for the present invention during the TiN deposition, stays relatively constant with time during the deposition, and after the TiN deposition, the data shows a slow cool down in the high vacuum environment. On the other hand, the original process, without quench, shows the TiN deposition temperature to be fairly high, near about 270° C. and then slowly cooling during deposition of the TiN. The two sets of data and resulting curves are vastly different, and this difference accounts for the difference in film properties, with the present invention solving the deleterious aluminum copper precipitate problem.

Note, wafer cooling methods that utilized pre-metal deposition cooling are considered ineffective, since the wafer's thermal mass is low and the wafer's thin cross-section and large area, allow for rapid heat transfer both in and out of the wafer. In addition, wafer cooling methods during metal wiring deposition are not considered desirable for the following: for good surface step coverage, for high aspect contact coverage, for uniform grain size control to achieve good electro-migration resistance, since low surface metal mobility occur at low temperatures. In addition, the original process without the rapid quench step need an addition anneal step. However, the method of this invention, utilizing a post-metal quench is considered both a desirable process and a desirable equipment approach to the wiring integrity problem, that is due to $AlCu_2$ precipitate formation.

In another application of the method described in the present invention, conductive wiring and contacts can be formed in a single or dual damascene build to fill trench and via structures, utilizing the aluminum copper alloy deposition and quench, then removing excess material and planarizing by a method selected from the group consisting of: chemical mechanical polish (CMP), milling, ion milling, and/or etching.

In addition, the methods described herein can be extended to fabricating multilevel conducting structures and contacts, by repeating the process steps described above, without an addition anneal step.

While the invention has been particularly shown and described with reference to the preferred embodiments thereof, it will be understood by those skilled in the art that various changes in form and details may be made without departing from the spirit and scope of the invention.

What is claimed is:

1. A method for fabricating conductive aluminum copper alloy wiring and contacts comprising:

providing a substrate over which is formed an interlevel dielectric;

depositing a first barrier metal layer over the interlevel dielectric;

depositing an aluminum copper alloy layer for conductive wiring over the first barrier layer;

rapidly cooling or quenching said substrate immediately after the deposition of aluminum copper alloy layer;

depositing a second barrier metal layer over the aluminum copper alloy layer;

patterning and forming conductive wiring and contacts in a three layer stack consisting of second barrier metal layer, aluminum copper alloy layer and first barrier metal layer.

2. The method of claim 1, wherein said substrate is semiconductor of mono-crystalline silicon or an IC module.

3. The method of claim 1, wherein the first and second metal barrier material is selected from the group consisting of TiN type compounds, deposited by sputtering, physical vapor deposition (PVD), in a thickness range between 100 to 2,000 Angstroms.

4. The method of claim 1, wherein the aluminum copper alloy layer is selected from the group consisting of Al—Cu alloys, and Al—Cu—Si alloys, in composition range of about (Al 99.5%, Cu 0.5% atomic percent) and (Al 98.5%, Cu 0.5%, Si 1.0% atomic percent), deposited by sputtering, physical vapor deposition (PVD), in a temperature range of between 150 to 450° C., and in a thickness range between 500 to 20,000 Angstroms.

5. The method of claim 1, wherein the rapid cool down or quench is performed immediately after the deposition of Al—Cu alloy layer or Al—Cu wiring layer, in situ by backside substrate or wafer cooling, using a common clamp or "e-chuck" wafer holder, and rapidly flowing helium gas or argon gas with a flow rate of between approximately 5 to 40 sccm, rapidly cooling down the wafer from a high temperature range of about 450 to 150° C., to a low temperature range near room temperature, in a short time interval between about 30 to 180 seconds.

6. The method of claim 1, wherein the conductive wiring can be formed in a single or dual damascene build, utilizing the aluminum copper alloy deposition and quench, removing excess material and planarizing by a method selected from the group consisting of:

chemical mechanical polish (CMP), milling, ion milling, and/or etching.

7. The method of claim 1, wherein multilevel conducting structures are fabricating by repeating the method described herein.

8. A method for fabricating conductive aluminum copper silicon alloy interconnects and contacts for applications in MOSFET and CMOS semiconductor devices comprising:

providing a substrate over which is formed an interlevel dielectric;

depositing a first barrier nitride layer over the interlevel dielectric;

depositing an aluminum copper alloy layer for conductive wiring over the first barrier nitride layer;

rapidly cooling or quenching said substrate immediately after the deposition of aluminum copper alloy layer;

depositing a second barrier nitride layer over the aluminum copper alloy layer;

patterning and forming conductive wiring and contacts in a three layer stack consisting of second barrier nitride layer, aluminum copper alloy layer and first barrier nitride layer.

9. The method of claim 8, wherein said substrate is semiconductor of mono-crystalline silicon or an IC module.

10. The method of claim 8, wherein the first and second nitride barrier layer is selected from the group consisting of TiN type compounds, deposited by sputtering, physical vapor deposition (PVD), in a thickness range between 100 to 2,000 Angstroms.

11. The method of claim 8, wherein the aluminum copper alloy layer is selected from the group consisting of Al—Cu alloys, and Al—Cu—Si alloys, in composition range of about (Al 99.5%, Cu 0.5% atomic percent) and (Al 98.5%, Cu 0.5%, Si 1.0% atomic percent), deposited by sputtering, physical vapor deposition (PVD), in a temperature range of between 150 to 450° C., and in a thickness range between 500 to 20,000 Angstroms.

12. The method of claim 8, wherein the rapid cool down or quench is performed immediately after the deposition of Al—Cu alloy layer or Al—Cu wiring layer, in situ by backside substrate or wafer cooling, using a common clamp or "e-chuck" wafer holder, and rapidly flowing helium gas or argon gas with a flow rate of between approximately 5 to 40 sccm, rapidly cooling down the wafer from a high temperature range of about 450 to 150° C., to a low temperature range near room temperature, in a short time interval between about 30 to 180 seconds.

13. The method of claim 8, wherein the conductive wiring can be formed in a single or dual damascene build, utilizing the aluminum copper alloy deposition and quench, removing excess material and planarizing by a method selected from the group consisting of:

chemical mechanical polish (CMP), milling, ion milling, and/or etching.

14. The method of claim 8, wherein multilevel conducting structures are fabricating by repeating the method described herein.

15. A method for fabricating conductive aluminum copper silicon alloy interconnects and contact vias for applications in MOSFET and CMOS semiconductor devices for trench/via fill single and dual damascene applications comprising:

providing a substrate over which is formed an interlevel dielectric;

providing in said substrate formed trench/via openings;

depositing a first barrier metal layer over the substrate and filling said trench/via openings;

depositing an aluminum copper alloy layer for conductive wiring over the first barrier layer;

rapidly cooling or quenching said substrate immediately after the deposition of aluminum copper alloy layer;

depositing a second barrier metal layer over the aluminum copper alloy layer;

polishing back the excess material to planarize the surface and form inlaid conductive wiring in a three layer stack consisting of second barrier metal layer, aluminum copper alloy layer and first barrier metal layer.

16. The method of claim 15, wherein said substrate is semiconductor of mono-crystalline silicon or an IC module.

17. The method of claim 15, wherein the first and second metal barrier layer material is selected from the group consisting of TiN type compounds, deposited by sputtering, physical vapor deposition (PVD), in a thickness range between 100 to 2,000 Angstroms.

18. The method of claim 15, wherein the aluminum copper alloy layer is selected from the group-consisting of Al—Cu alloys, and Al—Cu—Si alloys, in composition range of about (Al 99.5%, Cu 0.5% atomic percent) and (Al 98.5%, Cu 0.5%, Si 1.0% atomic percent), deposited by sputtering, physical vapor deposition (PVD), in a temperature range of between 150 to 450° C., and in a thickness range between 500 to 20,000 Angstroms.

19. The method of claim 15, wherein the rapid cool down or quench is performed immediately after the deposition of Al—Cu alloy layer or Al—Cu wiring layer, in situ by backside substrate or wafer cooling, using a common clamp or "e-chuck" wafer holder, and rapidly flowing helium gas or argon gas with a flow rate of between approximately 5 to 40 sccm, rapidly cooling down the wafer from a high temperature range of about 450 to 150° C., to a low temperature range near room temperature, in a short time interval between about 30 to 180 seconds.

20. The method of claim 15, wherein the conductive wiring can be formed in a single or dual damascene build, utilizing the aluminum copper alloy deposition and quench, removing excess material and planarizing by a method selected from the group consisting of:

chemical mechanical polish (CMP), milling, ion milling, and/or etching.

21. The method of claim 15, wherein multilevel conducting structures are fabricating by repeating the method described herein.

22. A method of fabricating defect free aluminum copper alloy layer comprising:

providing a substrate over which is formed an interlevel dielectric;

depositing a first barrier nitride layer over the interlevel dielectric by reactive sputtering at about room temperature to 150° C.;

depositing an aluminum copper alloy layer for conductive wiring over the first barrier nitride layer by sputtering in a temperature range between 150 to 450° C.;

rapidly cooling or quenching said substrate in situ immediately after the deposition of aluminum copper alloy layer to near room temperature in about 30 to 180 seconds;

depositing a second barrier nitride layer over the aluminum copper alloy layer;

patterning and forming conductive wiring and contacts in a three layer stack consisting of second barrier metal layer, aluminum copper alloy layer and first barrier metal layer.

23. The method of claim 22, wherein said substrate is semiconductor of mono-crystalline silicon or an IC module.

24. The method of claim 22, wherein the first and second nitride barrier layer is selected from the group consisting of TiN type compounds, deposited by sputtering, physical vapor deposition (PVD), in a thickness range between 100 to 2,000 Angstroms.

25. The method of claim 22, wherein the aluminum copper alloy layer is selected from the group consisting of Al—Cu alloys, and Al—Cu—Si alloys, in composition range of about (Al 99.5% Cu 0.5% atomic percent) and (Al 98.5%, Cu 0.5%, Si 1.0% atomic percent), deposited by sputtering, physical vapor deposition (PVD), in a temperature range of between 150 to 450° C., and in a thickness range between 500 to 20,000 Angstroms.

26. The method of claim 22, wherein the rapid cool down or quench is performed immediately after the deposition of Al—Cu alloy layer or Al—Cu wiring layer, in situ by backside Substrate or wafer cooling, using a common clamp or "e-chuck" wafer holder, and rapidly flowing helium gas or argon gas with a flow rate of between approximately 5 to 40 sccm, rapidly cooling down the wafer from a high temperature range of about 450 to 150° C., to a low temperature range near room temperature, in a short time interval between about 30 to 180 seconds.

27. The method of claim 22, wherein the conductive wiring can be formed in a single or dual damascene build, utilizing the aluminum copper alloy deposition and quench, removing excess material and planarizing by a method selected from the group consisting of:

chemical mechanical polish (CMP), milling, ion milling, and/or etching.

28. The method of claim 22, wherein multilevel conducting structures are fabricating by repeating the method described herein.

* * * * *